(12) United States Patent
Aoki

(10) Patent No.: US 10,283,063 B2
(45) Date of Patent: May 7, 2019

(54) DISPLAY DEVICE AND SHIFT REGISTER CIRCUIT

(71) Applicant: Japan Display Inc., Minato-ku (JP)

(72) Inventor: Yoshiro Aoki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/723,218

(22) Filed: Oct. 3, 2017

(65) Prior Publication Data

US 2018/0108312 A1 Apr. 19, 2018

(30) Foreign Application Priority Data

Oct. 18, 2016 (JP) ................. 2016-204229

(51) Int. Cl.
| | |
|---|---|
| *G09G 3/36* | (2006.01) |
| *G09G 3/3225* | (2016.01) |
| *H01L 27/12* | (2006.01) |
| *G09G 3/3258* | (2016.01) |
| *G09G 3/3266* | (2016.01) |

(52) U.S. Cl.
CPC ......... *G09G 3/3648* (2013.01); *G09G 3/3225* (2013.01); *G09G 3/3258* (2013.01); *G09G 3/3266* (2013.01); *G09G 3/3614* (2013.01); *G09G 3/3677* (2013.01); *G09G 3/3688* (2013.01); *H01L 27/1225* (2013.01); *H01L 27/1255* (2013.01); *G09G 2300/0842* (2013.01); *G09G 2300/0852* (2013.01); *G09G 2300/0857* (2013.01); *G09G 2310/0256* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 5,712,652 A | 1/1998 | Sato et al. | |
| 2002/0075205 A1* | 6/2002 | Kimura | G09G 3/3659 345/55 |
| 2002/0084967 A1 | 7/2002 | Akimoto et al. | |

FOREIGN PATENT DOCUMENTS

| | | |
|---|---|---|
| JP | 8-286170 | 11/1996 |
| JP | 2002-207453 | 7/2002 |
| JP | 4552069 | 9/2010 |

* cited by examiner

*Primary Examiner* — Christopher J Kohlman
(74) *Attorney, Agent, or Firm* — Oblon, McClelland, Maier & Neustadt, L.L.P.

(57) ABSTRACT

According to one embodiment, a display device includes a pixel circuit including first, second and third switches, a capacitor and an inverter, and a pixel electrode connected to the pixel circuit, the first switch including a first control electrode connected to a gate line and a first input terminal connected to a source line, the capacitor including a first terminal connected to a reference potential and a second terminal connected to the first output terminal, the third switch including a second input terminal and a second output terminal connected to the second terminal, and the second switch and the inverter being connected in series between the second terminal and the second input terminal.

11 Claims, 11 Drawing Sheets

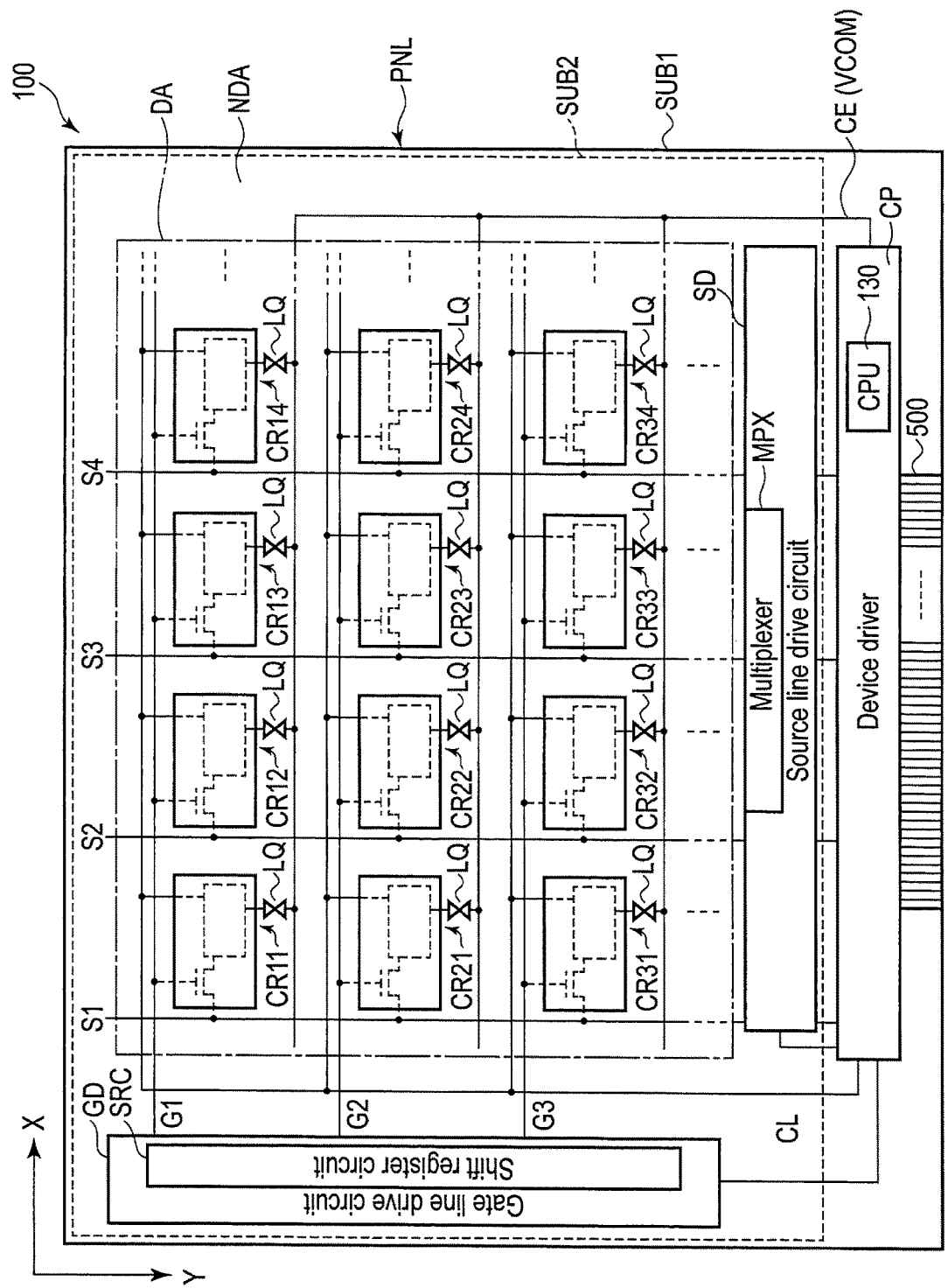
F I G. 1

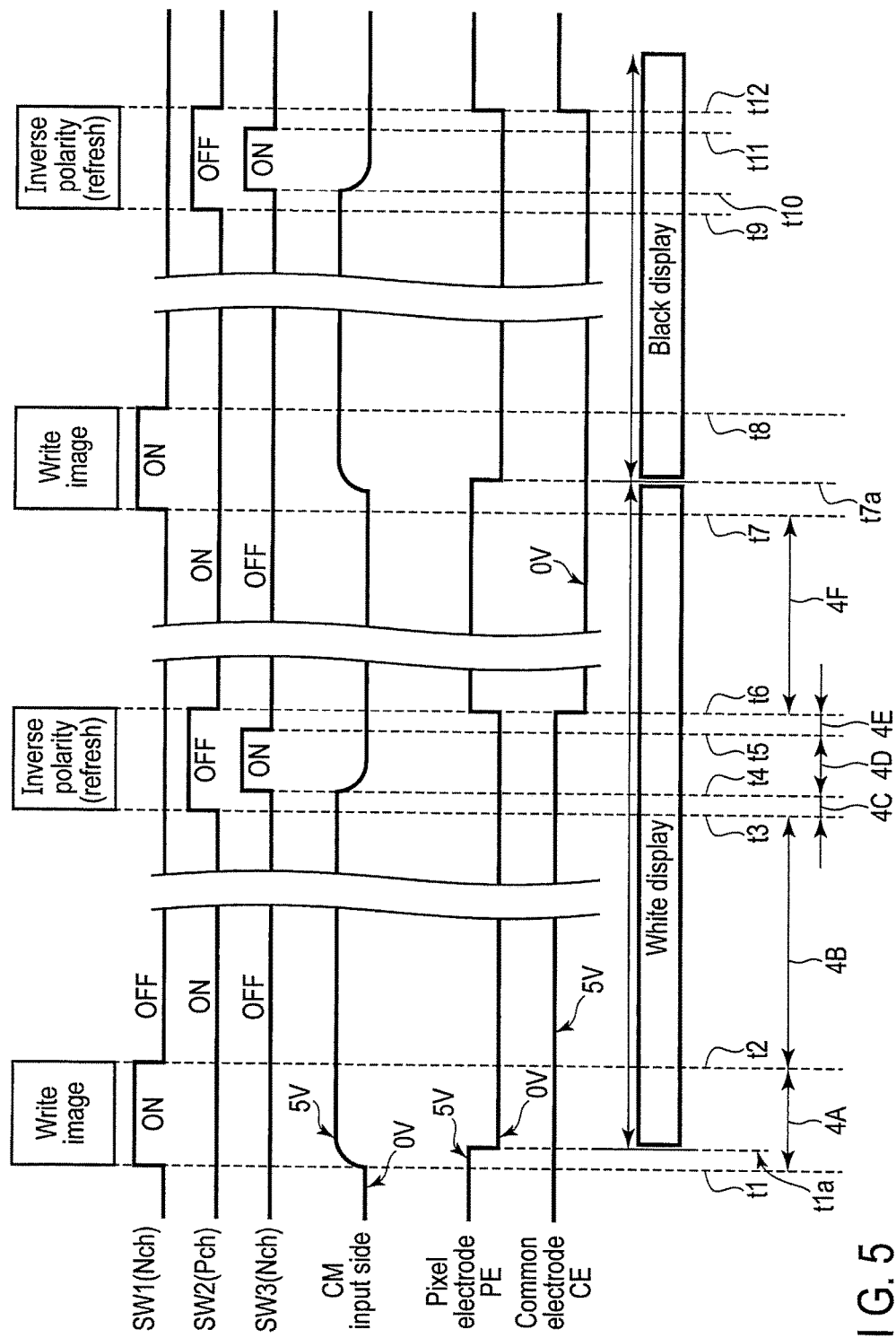
F I G. 5

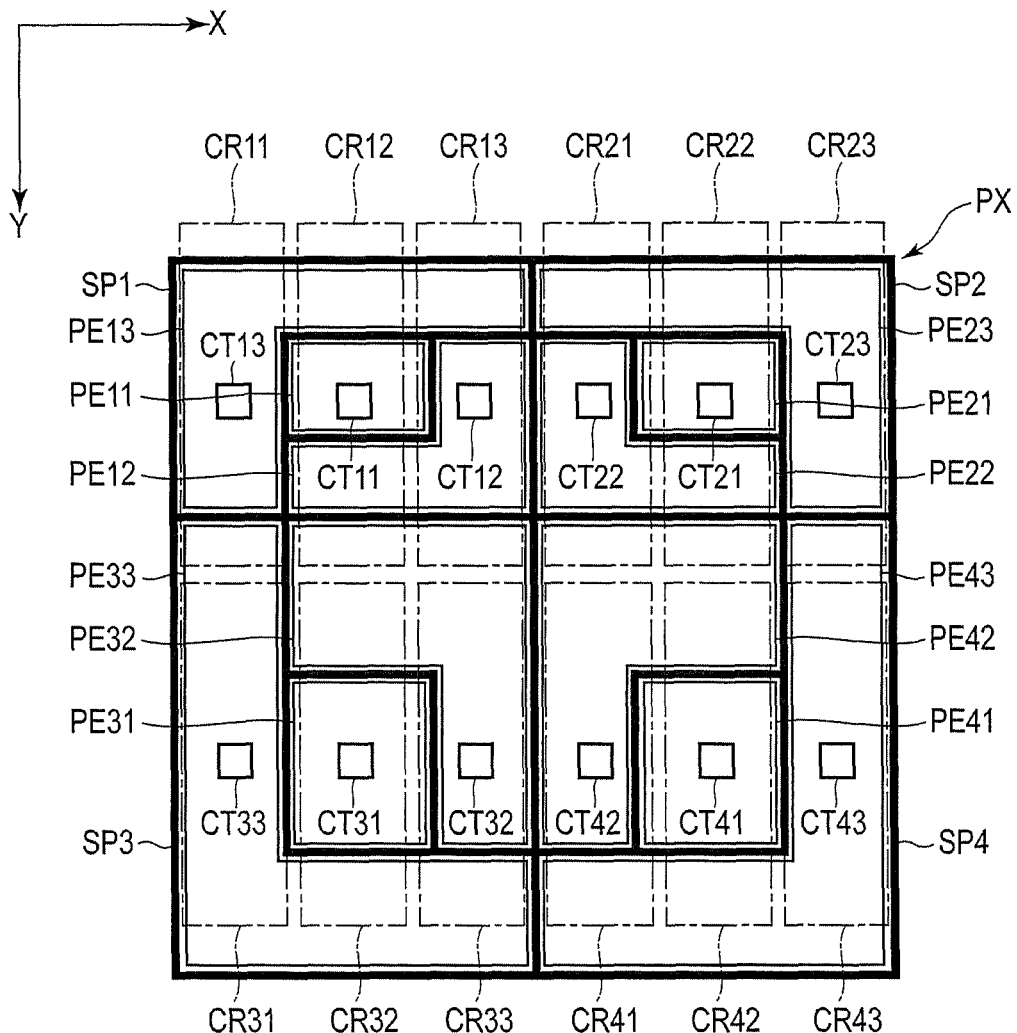
F I G. 7

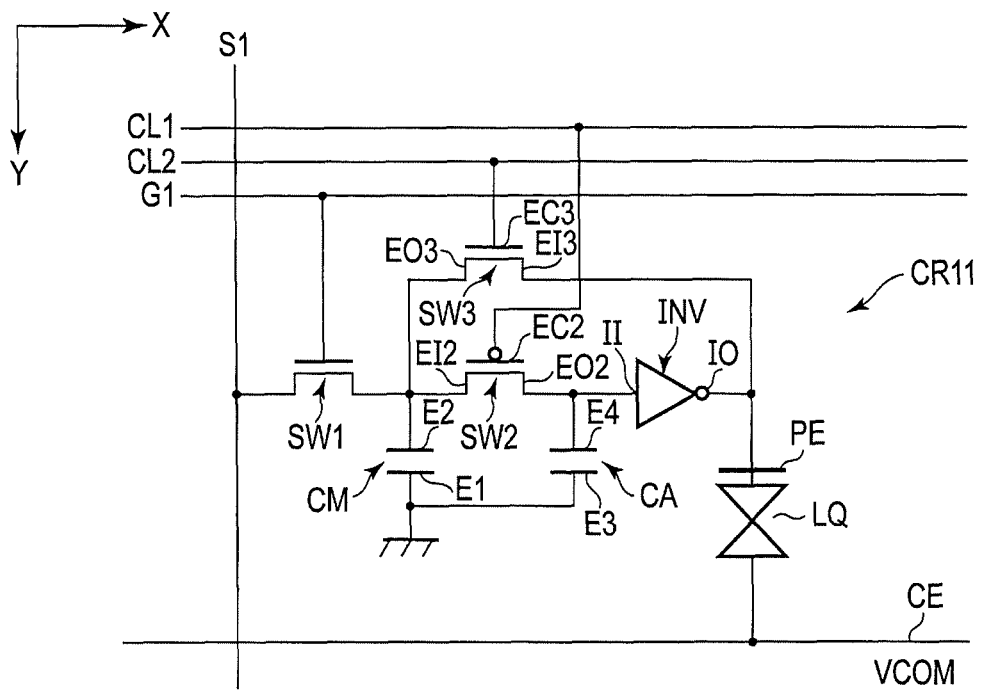
F I G. 8
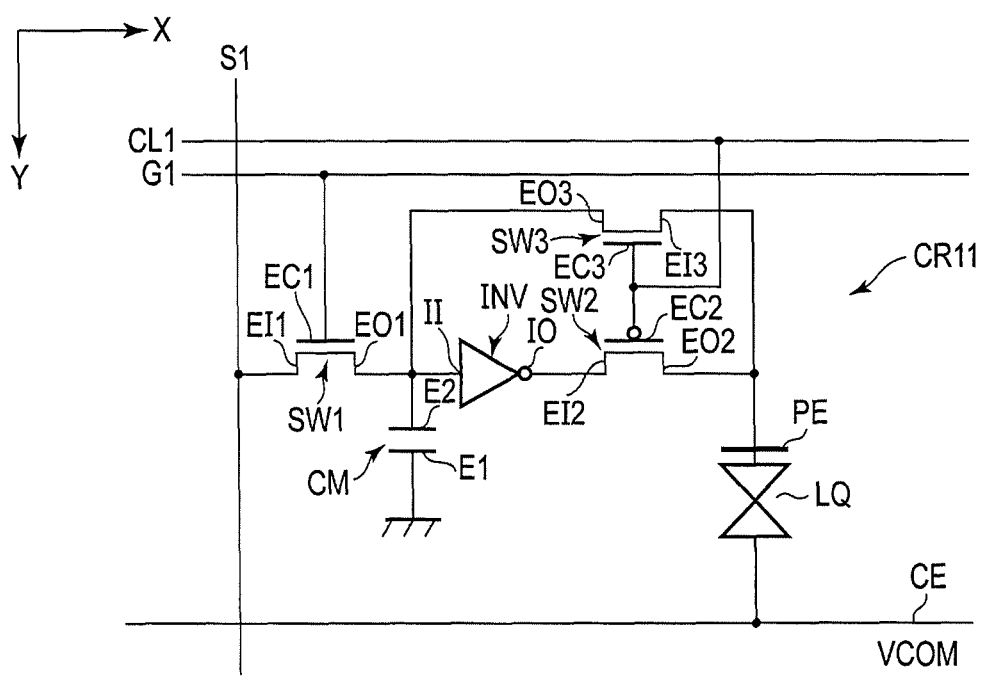
F I G. 9

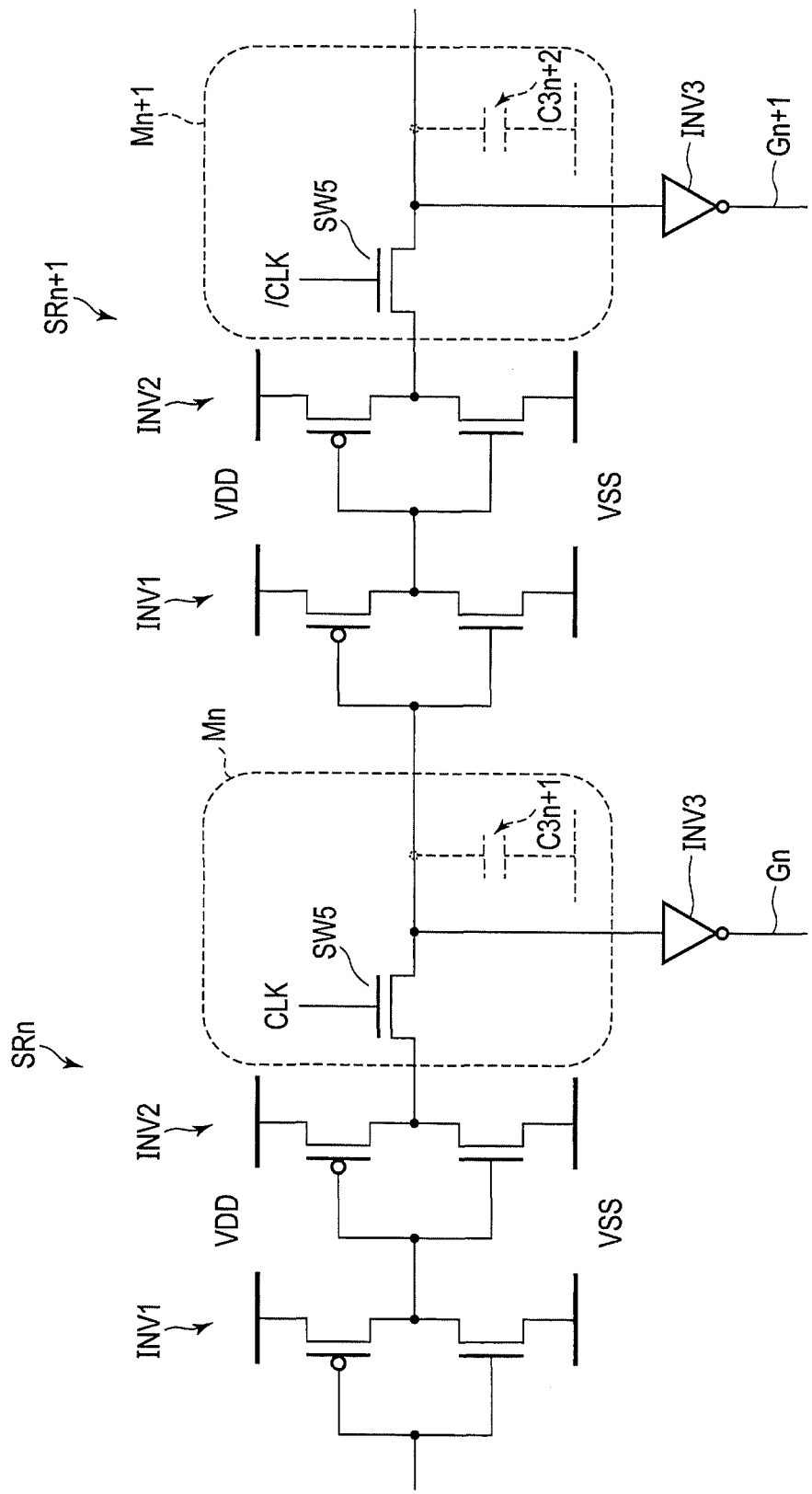
F I G. 13

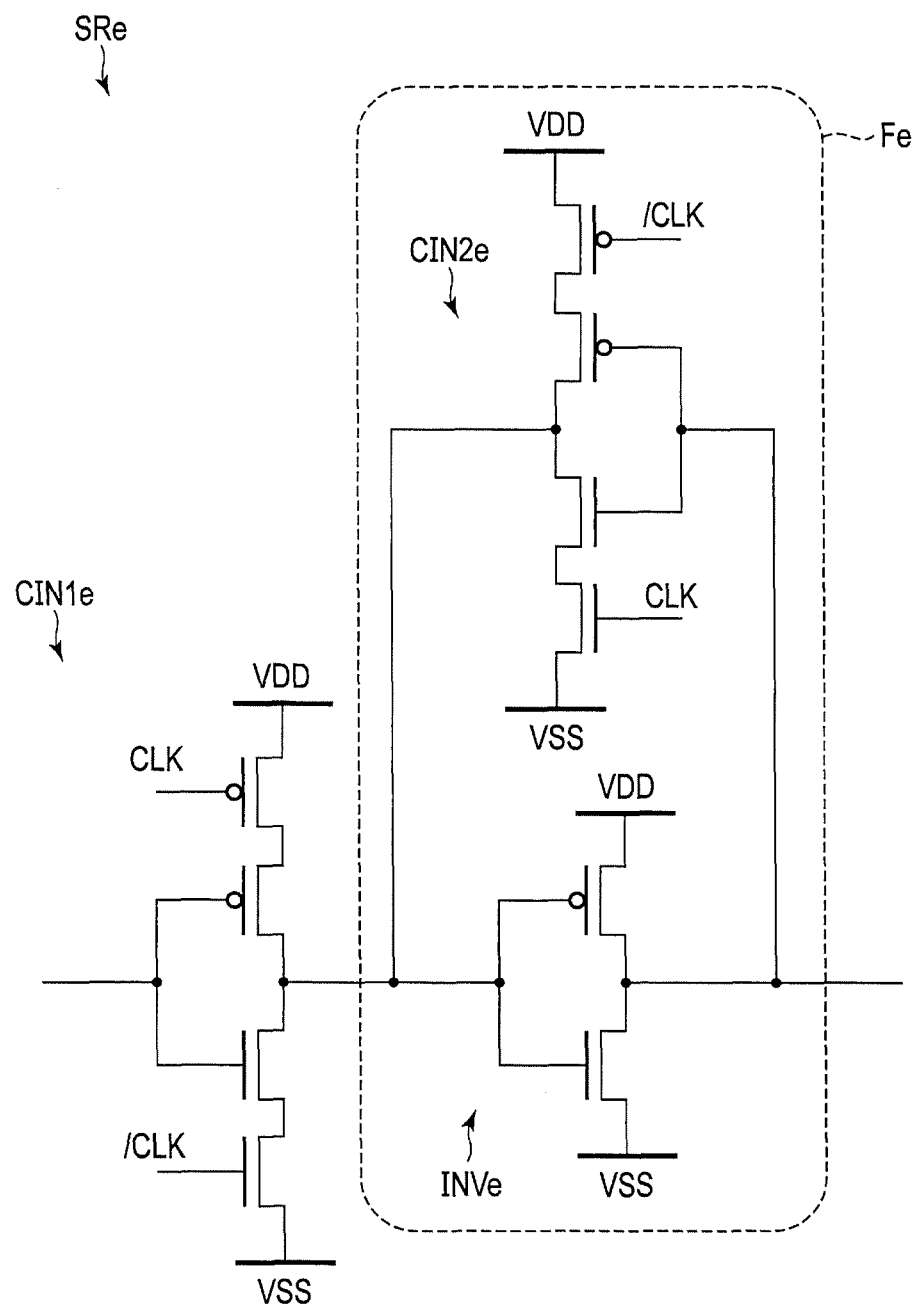
F I G. 14

DISPLAY DEVICE AND SHIFT REGISTER CIRCUIT

CROSS-REFERENCE TO RELATED APPLICATIONS

This application is based upon and claims the benefit of priority from Japanese Patent Application No. 2016-204229, filed Oct. 18, 2016, the entire contents of which are incorporated herein by reference.

FIELD

Embodiments described herein relate generally to a display device and a shift register circuit.

BACKGROUND

In liquid crystal display devices, a plurality of pixel circuits are arrayed along an X-direction (, which may be referred to as row direction) and a Y-direction (, which may be referred to as a column direction). The X-direction crosses the Y-direction. For example, a plurality of gate lines parallel to the X-direction are arranged at certain intervals along the Y-direction. Further, a plurality of source lines parallel to the Y-direction are arranged at certain intervals along the X-direction. The pixel circuits are located near intersections of the gate lines and the source lines, respectively.

In some liquid crystal display devices, the pixel circuits each comprise a digital memory. With the pixel circuits with digital memories, when, for example, a static image is displayed in the entire display area of the device for a long time, pixel signals need not be rewritten to all the source lines. Thus, power consumption can be reduced in the device. In addition, when a static image is displayed in a part of the display area, and moving images are displayed in the remaining part, there is no need to frequently apply voltage to all the source lines. In this case, too, the power consumption of the display device can be reduced because the pixel signal for moving images should be supplied only to source lines of the rest of the display area.

BRIEF DESCRIPTION OF THE DRAWINGS

FIG. 1 is a diagram schematically showing a configuration example of a display device of a first embodiment.

FIG. 5 is a time chart showing operation state and voltage change of the members illustrating the operation example of the pixel circuit, shown in FIG. 4.

FIG. 7 is a plan view of an example of arrangement of pixel circuits and pixel electrodes.

FIG. 8 is a diagram schematically showing a configuration example of a pixel circuit of a display device according to a second embodiment.

FIG. 9 is a diagram schematically showing a configuration example of a pixel circuit of a display device according to a third embodiment.

FIG. 13 is a diagram schematically showing a configuration example of a shift register of a display device according to a seventh embodiment.

FIG. 14 is a diagram showing a configuration example of a shift register as a comparative example.

DETAILED DESCRIPTION

Figure 2:
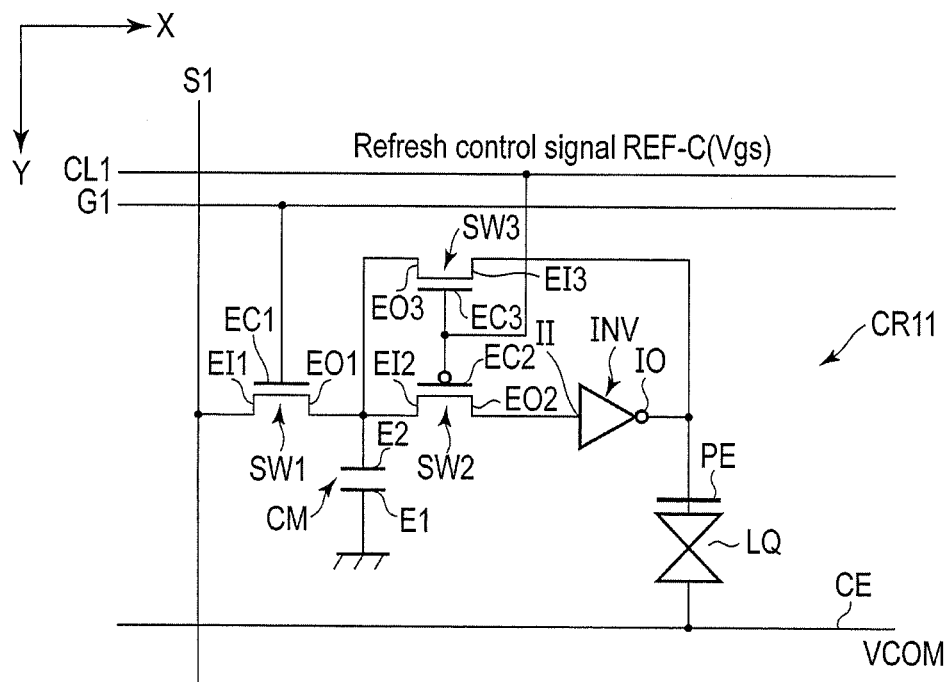
FIG. 2 is a diagram showing a typical configuration example of a pixel circuit shown in FIG. 1.

In general, according to one embodiment, display device comprises: a gate line arranged above a substrate along a first direction; a source line arranged above the substrate along a second direction crossing the first direction; a pixel circuit connected to the gate line and the source line and comprising a first switch, a second switch, a third switch, a capacitor and an inverter; and a pixel electrode connected to the pixel circuit, which supplies voltage to a display element, the first switch being formed from an oxide semiconductor layer and comprising a first control electrode connected to the gate line and a first input terminal connected to the source line, the capacitor comprising a first terminal connected to a reference potential and a second terminal connected to the first output terminal, the third switch comprising a second input terminal and a second output terminal connected to the second terminal, and the second switch and the inverter being connected in series between the second terminal and the second input terminal.

According to another embodiment, a shift register circuit comprises a plurality of shift registers connected in series, which sequentially supply gate line drive signals, each comprising an output terminal connected to each respective gate line, each shift register comprising: an inverter comprising a sixth input terminal and a sixth output terminal, a fifth switch comprising a seventh input terminal connected to the sixth output terminal and seventh output terminal, and being formed from an oxide semiconductor layers, and a capacitor comprising a fifth terminal connected to a reference potential and a sixth terminal connected to the seventh output terminal.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

In the present embodiment, a liquid crystal display device will be described as an example of the display device. For example, the display device is applicable to various devices such as smartphones, tablet computers, feature phones, personal computers, TVs, in-car devices, and game consoles. The major configuration explained in the present embodiments can also be applied to a self-luminous display device comprising an organic electroluminescent (EL) element and the like, an electronic paper display device comprising an electrophoretic element and the like, a display device adopting micro-electromechanical systems (MEMS), or a display device adapting electrochromism.

FIG. 1 schematically shows a configuration of a display device 100 of the present embodiment. The display device 100 comprises a display panel PNL, a gate line drive circuit GD, a source line drive circuit SD, a device driver CP and the like.

The display panel PNL comprises a first substrate (, which may be referred to as an array substrate) SUB1 and a second substrate (, which may be referred to as a counter-substrate) SUB2. The first substrate SUB1 and the second substrate SUB2 are a pair of transparent insulating substrates disposed to oppose each other. A liquid crystal layer (, which may be referred to as a liquid crystal element) LQ functioning as a display function layer (display element) is held between the first substrate SUB1 and the second substrate SUB2.

The display panel PNL of the present embodiment is a reflective type which selectively reflects light from above (the front surface side) of the second substrate SUB2, to display images. But, the display panel PNL may be of, for example, a transmissive type which selectively passes light from below (an opposite side to the front surface) of the first substrate SUB1 to display images, a trans-reflective type comprising a transmissive display function and a reflective display function.

The liquid crystal display panel PNL includes a display area DA and a non-display area NDA surrounding the display area DA. The display area DA substantially corresponds to the region where the liquid crystal layer LQ is provided and comprises a plurality of pixel circuits CR (CR11, CR12, ..., CR21, CR22, ..., CR31, CR32, ...) arranged in a matrix. In the non-display area NDA, the gate line drive circuit GD, the source line drive circuit SD, the device driver CP and the like are located.

The first substrate SUB1 comprises a plurality of gate lines G (G1 to Gn) extending along a first direction X and arranged alongside each other and a plurality of source lines S (S1 to Sm) extending along a second direction Y crossing the first direction X and arranged alongside each other, in the display area DA.

The pixel circuits CR are each located near the intersection of each one of the gate lines G and each respective one of the source lines S. The pixel circuits CR store image data (, which may be referred to as video image data) supplied from the source lines S and supplies potential (signal potential) corresponding to the image data to the respective pixel electrodes. In the liquid crystal element LQ, the alignment of liquid crystal molecules is controlled by voltage applied between a pixel electrode and the common electrode CE commonly provided for a plurality of pixel circuits CR. The reflectivity and transmissivity of light incident on the display panel PNL vary according to the alignment of the liquid crystal molecules, thereby displaying images.

The gate lines G (G1 to Gn) are drawn to the non-display area NDA and are connected to the gate line drive circuit (, which may be referred to as the first drive circuit) GD. The gate line driving circuit GD comprises a shift register circuit SRC which supplies a gate line driving signal (, which may be referred to as a gate pulse) to the gate lines G sequentially. The source lines S (S1 to Sm) are drawn to the non-display area NDA and are connected to the source line drive circuit (, which may be referred to as the second drive circuit) SD. For example, at least a part of each of the gate line driving circuit GD and the source line drive circuit SD is formed in the first substrate SUB1, and connected to the device driver (, which may be referred to as a liquid crystal driver or driver IC chip) CP.

The device driver CP controls the gate line driving circuit GD, the source line drive circuit SD and the like, to control the display state. Moreover, the device driver CP supplies potential to the common electrode CE. The device driver CP comprises integrated circuits and includes a power supply circuit, a booster circuit, a central processing circuit CPU, an image data processing circuit, etc., within the device. The device driver CP is connected to an end of a flexible wiring substrate through a connection terminal 500. The other end of the flexible wiring substrate is connected to the host device (not shown) (, which may be referred to as a controller). The host device can communicate mutually with device driver CP and output image data, synchronizing pulses, etc.

Next, with reference to FIG. 2, a configuration example of the pixel circuit CR will be described.

FIG. 2 shows a pixel circuit CR11 as a typical example, which shares a configuration similar to that of the other pixel circuits CR.

The pixel circuit CR11 comprises a first switch SW1, a second switch SW2, a third switch SW3, a capacitor CM and an inverter INV.

The first switch SW1 is an n-type thin film transistor (TFT) formed from a transparent amorphous oxide semiconductor (TAOS). The first switch SW1 comprises a control electrode EC1, an input terminal EI1 and an output terminal EO1.

The second switch SW2 is a p-type thin film transistor formed from, for example, a low-temperature polycrystalline silicon (LTPS). The second switch SW2 comprises a control electrode EC2, an input terminal EI2 and an output terminal EO2.

The third switch SW3 is a thin film transistor (TFT) formed from a transparent amorphous oxide semiconductor (TAOS). The third switch SW3 comprises a control electrode EC3, an input terminal EI3 and an output terminal EO3.

The inverter INV comprises an input terminal II and an output terminal IO. The capacitor CM comprises a terminal E1 and a terminal E2.

The control electrode EC1 is connected to the gate line G1. Thereby, the turning on/off (closing/opening) of the first switch SW1 is controlled by the gate pulse from the gate line G1. The input terminal EI1 is connected to the source line S1. The output terminal EO1 is connected to the terminal E2 and the input terminal EI2. The terminal E1 is connected to a reference potential. When the first switch SW1 is on (closed), the signal potential supplied from the source line S1 is supplied to the terminal E2. In other words, the capacitor CM holds 1-bit image data supplied from the source line S1.

The output terminal EO2 is connected to the input terminal II. The output terminal IO is connected to the pixel electrode PE and also to the input terminal EI3. The inverter INV comprises a p-channel thin film transistor and an n-channel thin film transistor connected in parallel and it inverts input signal potentials. The output terminal EO3 is connected to the terminal E2.

The control electrode EC2 and the control electrode EC3 are connected commonly to a first control line CL1 which supplies a refresh control signal REF-C.

Figure 3:
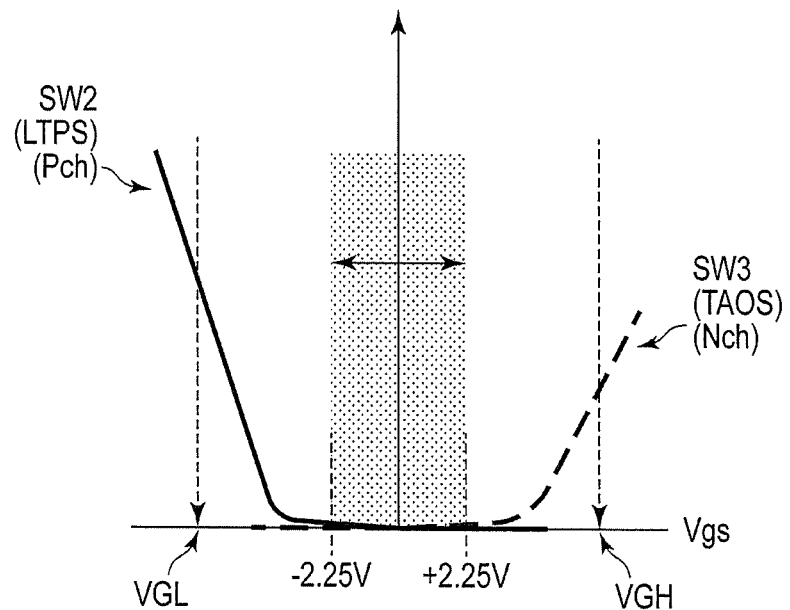
FIG. 3 is a diagram illustrating the operation characteristics of switches which constitute the pixel circuit shown in FIG. 2.

FIG. 3 shows operation characteristics of the second switch SW2 and the third switch SW3. In the example illustrated, when the gate-source voltage Vgs (for example, voltage between the control electrode EC2 and the input terminal EI2) is −2.25V or lower, current starts to flow through the p-channel second switch SW2 and the gate-source voltage Vgs becomes substantially between VGL, the switch is set perfectly in an on state. As to the n-channel third switch SW3, when the gate-source voltage Vgs (for example, voltage between the control electrode EC3 and the input terminal EI3) is +2.25V or higher, current starts to flow and when the gate-source voltage Vgs becomes substantially VGH, the switch is set perfectly in an on state.

When the gate-source voltage Vgs is at a value between the threshold voltage Vth (−2.25V) of the second switch SW2 and the threshold voltage Vth (+2.25V) of the third switch SW3, both the switches SW2 and SW3 are off (open). By utilizing the operation characteristics, the switch SW2 and SW3 are control to be both set in the off state, or one in the on (closed) state and the other in the off (open) state by the refresh control signal REF-C.

Figure 4:
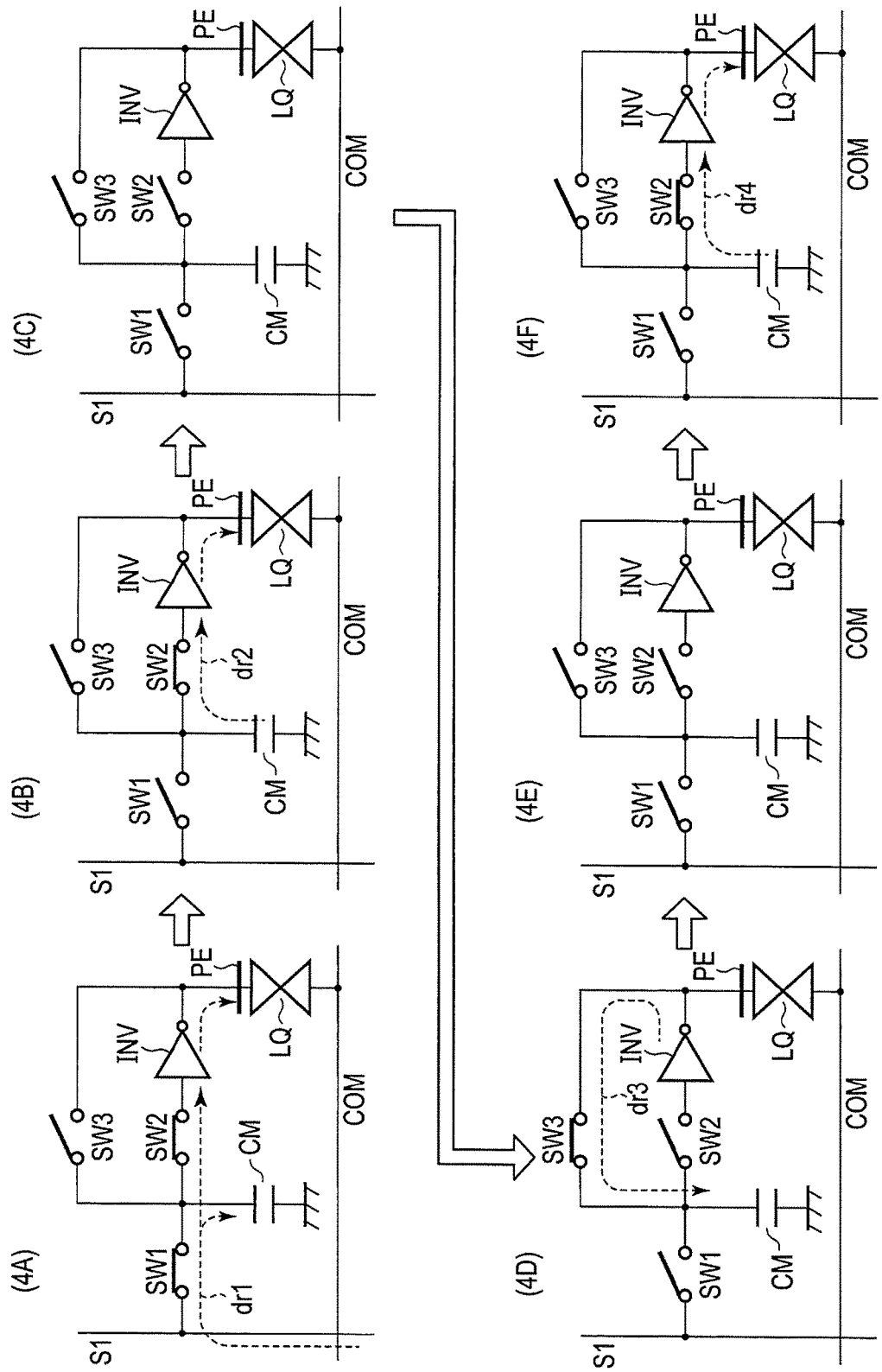
FIG. 4 is a diagram showing transition of circuit state illustrating an operation example of the pixel circuit shown in FIG. 2.

FIG. 4 is a diagram showing transition of the state of the pixel circuit CR to illustrate an operation example of the pixel circuit CR described above. FIG. 4 shows in part (4A) a situation that the first switch SW1 and the second switch SW2 are on and the third switch SW3 is off, and image data (signal potential) is written in the capacitor CM from the source line S1 as indicated by arrow dr1.

Next, when the image data is written in the capacitor CM, as shown in FIG. 4, part (4B), the first switch SW1 is turned off, the second switch SW2 is on and the third switch SW3 is turned off. Thereby, the image data is held in the capacitor CM. Then, as indicated by arrow dr2, voltage is applied from the inverter INV to the pixel electrode PE based on the image data held (to be referred to also holding data). The liquid crystal element LQ is driven by the voltage according to the holding data.

Next, refresh operation will be described. The refresh operation is to re-write image data in the capacitor CM in order to prevent degradation of the image data held in the capacitor CM, which is caused by leaking from the capacitor CM, i.e., the decrease in the signal potential held in the capacitor CM.

As the start of refreshing, as shown in FIG. 4, part (4C), the first switch SW1 is off, the second switch SW2 is off and the third switch SW3 is off. Then, as shown in FIG. 4, part (4D), the first switch SW1 is off, the second switch SW2 is off and the third switch SW3 is set to on. Thereby, as indicated by arrow dr3, the potential on an output side of the inverter INV is supplied to the capacitor CM via the third switch SW3. As a result, a potential of inverted polarity is held in the capacitor CM.

Next, as shown in FIG. 4, part (4E), the first switch SW1 is off, the second switch SW2 is off and the third switch SW3 is turned off. Subsequently, as shown in FIG. 4, part (4F), the first switch SW1 is off, the second switch SW2 is turned on and the third switch SW3 is off.

Thus, as indicated by arrow dr4, the potential on the output side of the inverter INV is supplied to the pixel electrode PE based on the holding data. As a result, the liquid crystal element LQ is driven by a voltage of inverted polarity, and one refreshing operation is completed.

FIG. 5 is a time chart showing the operation state of each member and the change in voltage, in order to illustrate an example of operation of the pixel circuit CR shown in FIG. 4. FIG. 5 shows the periods respectively corresponding to the states (4A to 4F) shown in FIG. 4.

Let us assume that as an initial state, a high-level potential (for example, 5V) is supplied to each of the pixel electrode PE and the common electrode CE. At this point, the potential difference between the pixel electrode PE and the common electrode CE, that is, the voltage being applied to the liquid crystal element LQ, is 0V. In the following descriptions, the state where no potential difference is created between the pixel electrode PE and the common electrode CE may be referred to as a "black display state" in the display device.

Meanwhile, let us assume that as an initial state, a low-level potential is supplied to the first control line CL1. At this time, the first switch SW1 is off (open), the second switch SW2 is on (closed) and the third switch SW3 is off (open).

Let us assume now that at a time t1, a high-level gate pulse is applied to the gate line G1, an image write period is started. This state is equivalent to that of part (4A) in FIG. 4. At this time, the first switch SW1 is set in the on state (closed). When a high-level signal potential (for example, 5V) is input to the source line S1, the signal potential is supplied to the terminal (input terminal) E2. Then, the potential at the terminal E2 rises from 0V and becomes 5V at the time t1a.

Since the second switch SW2 is in the on (closed) state, when the charging on the capacitor CM is completed at the time t1a, the high-level signal potential (5V) is input to the inverter INV via the second switch SW2. The high-level signal potential (5V) is inverted by the inverter INV and is output as a low-level signal potential (for example, 0V) from the output terminal IO. Thus, the potential at the pixel electrode PE is inverted from 5V to 0V at the time t1a.

Meanwhile, to the common electrode CE, the high-level potential (5V) is being continuously supplied. Therefore, at the time t1a, the voltage being applied to the liquid crystal element LQ, i.e., the potential difference between the pixel electrode PE and the common electrode CE, is 5V. The state where a potential difference is created between the pixel electrode PE and the common electrode CE may be referred to as a "white display state" of the display device. At the time t1a, the potential at the pixel electrode PE is lower than that of the common electrode CE. Therefore, with reference to the potential at the common electrode CE, it is equivalent to that a voltage of −5V is applied to the liquid crystal element LQ. In other words, at the time t1a, the display device 100 is in the white display state, where a voltage of −5V is applied to the liquid crystal element LQ.

Next, at the time t2, a low-level potential is supplied to the gate line G1, and the write period is finished. This state is equivalent to that of part (4B) in FIG. 4. At this time, the first switch SW1 is set in the off (open) state. However, the second switch SW2 is maintained in the on (closed) state, the high-level signal potential (5V) held at the capacitor CM is input to the inverter INV via the second switch SW2. From the output terminal IO, the low-level signal potential (0V) is output. Therefore, the potential at the pixel electrode PE is maintained at 0V. That is, the voltage applied to the liquid crystal element LQ is maintained at −5V, and the white display state of the display device 100 is maintained.

Next, the capacitor CM is refreshed. In the refresh operation, a high-level potential is supplied to the first control line CL1. Thus, the second switch SW2 is turned off (opened) and the third switch SW3 is turned on (closed). As described above, the switching time for the second switch SW2 and the switching time for the third switch SW3 can be separated from each other by adjusting the voltage (refresh control signal REF-C) applied to the control electrode EC2 and the control electrode EC3.

That is, at the time t3, first, the second switch SW2 is switched from on to off. This state is equivalent to that of part (4C) in FIG. 4. Then, at the time t4, the third switch SW3 is switched from off to on. This state is equivalent to that of part (4D) in FIG. 4. When the third switch SW3 is turned on while the second switch SW2 is in the off state at the time t4, the low-level signal potential (0V) output from the inverter INV is again input to the capacitor CM via the third switch SW3. Thereby, the potential at the terminal E2 decreases from 5V to 0V. Thus, a voltage of inverted polarity is held at the capacitor CM.

Next, when a low-level potential is supplied to a first control line CL1a, the refreshing period is finished. At the time t5, first, the third switch SW3 is switched from on to off. This state is equivalent to that of part (4E) in FIG. 4. Then, at the time t6, the second switch SW2 is switched from off to on. This state is equivalent to that of part (4F) in FIG. 4. When the second switch SW2 is turned on while the third switch SW3 is in the off state at the time t6, the low-level signal potential (0V) being held at the capacitor CM is input to the inverter INV via the second switch SW2. The low-level signal potential (0V) input to the inverter INV is inverted by the inverter INV and is output as a high-level signal potential (5V) from the output terminal IO. Therefore, at the time t6, the potential at the pixel electrode PE becomes 5V from 0V.

In this embodiment, the potential of the common electrode CE is inverted in synchronism with the switching of the second switch SW2 caused by the refresh operation. That is, at the time t6, simultaneously with the switching of the second switch SW2 from off to on and the supplying of the high-level signal potential (5V) to the pixel electrode PE from the inverter TNV, the potential at the common electrode CE is inverted to the low level (0V) from the high level (5V). Thus, at the time t6, the voltage being applied to the liquid crystal element LQ, i.e., the potential difference between the pixel electrode PE and the common electrode CE becomes 5V. At this time, the voltage applied to the liquid crystal element LQ is +5V with reference to the potential at the common electrode CE, and therefore its polarity is inverted with respect to the voltage applied to the liquid crystal element LQ at the time t1a. On the other hand, the potential difference between the pixel electrode PE and the common electrode CE still remains at 5V. That is, the white display of the display device 100 is maintained.

Next, at the time t7, a high-level gate pulse is applied to the gate line G1 and the next image write period is started. At this time, the first switch SW1 is set in the on (closed) state. When a high-level signal potential (5V) is input to the source line S1, the signal potential is held at the capacitor CM via the first switch SW1. The potential at the terminal E2 rises from 0V, and becomes 5V at the time t7a.

The second switch SW2 is in the on (closed) state, and therefore if the charging for the capacitor CM is completed at the time t7a, the high-level signal potential (5V) is input to the inverter INV via the second switch SW2. The high-level signal potential (5V) is inverted by the inverter INV and is output as a low-level signal potential (0V) from the output terminal IO. Thus, the potential at the pixel electrode PE is inverted to 0V from 5V at the time t7a.

Meanwhile, a potential of 0V is being continuously supplied to the common electrode CE. Therefore, the voltage being applied to the liquid crystal element LQ, i.e., the potential difference between the pixel electrode PE and the common electrode CE, is 0V. Thus, the display device 100 is in a black display state from the time t7a.

Next, at the time t8, a low-level potential is supplied to the gate line G1 and the write period is finished. Here, the second switch SW2 is maintained in the on (closed) state, and therefore the high-level signal potential (5V) held at the capacitor CM is supplied to the pixel electrode PE as a low-level signal potential (0V) via the second switch SW2 and the inverter INV. Thus, the black display state of the display device 100 is maintained.

After that, the capacitor CM is refreshed as in the case described above. More specifically, at the time t9, the second switch SW2 is switched from on to off, and then at the time t10, the third switch SW3 is switched from off to on. Thus, the low-level signal potential (0V) output from the inverter INV is again input to the capacitor CM via the third switch SW3. The potential at the terminal E2 decreases to 0V from 5V and the polarity of the voltage held at the capacitor CM is inverted.

Next, at the time t11, the third switch SW3 is switched from on to off, and then at the time t12, the second switch SW2 is switched from off to on. The low-level signal potential (0V) held at the capacitor CM is output as a high-level signal potential (5V) via the second switch SW2 and the inverter INV. Thus, the potential of the pixel electrode PE is set to 5V from 0V.

Meanwhile, the potential of the common electrode CE is inverted to a high level (5V) from a low level (0V) at the time t12. More specifically, at the time t12, the potentials supplied to pixel electrode PE and the common electrode CE are both inverted, whereas the potential difference between the pixel electrode PE and the common electrode CE, i.e., the voltage being applied to the liquid crystal element LQ, is still 0V. Therefore, the black display of the display device 100 is maintained.

Figure 6:
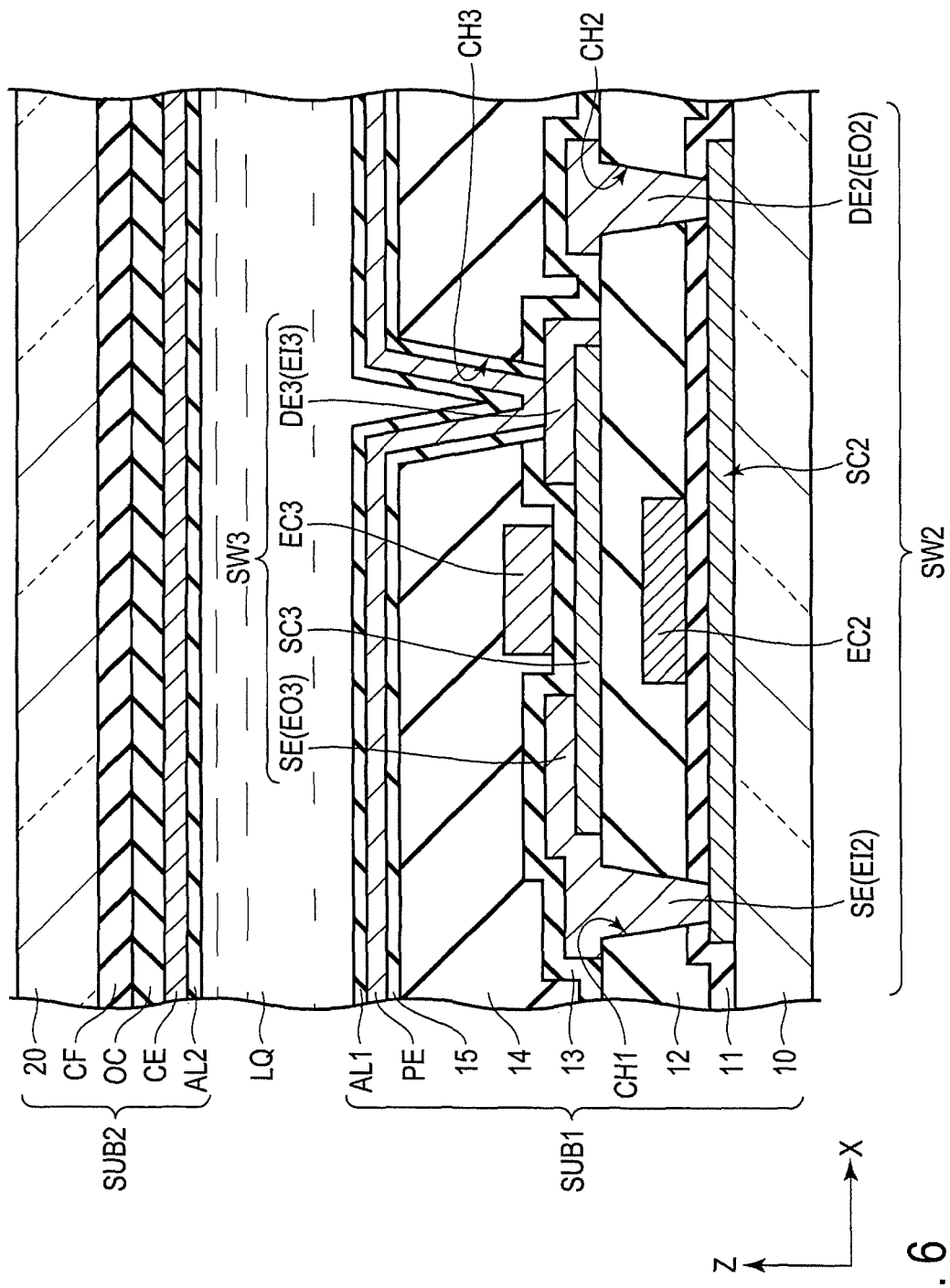
FIG. 6 is a cross section showing an example of a display area shown in FIG. 1.

FIG. 6 is a cross section showing a part of the display panel PNL. Here, only the structure required for explanation is shown.

The display panel PNL comprises a first substrate SUB1, a second substrate SUB2 and a liquid crystal layer LQ provided between the first substrate SUB1 and the second substrate SUB2. The display panel PNL of this embodiment is configured for the vertical electric field mode which utilizes a vertical electric field substantially orthogonal to the main surface of the substrate, as a mode for driving the liquid crystal.

The first substrate SUB1 is formed from a transparent first insulating substrate 10 of, for example, glass or resin. The first substrate SUB1 comprises a second switch SW2, a third switch SW3, the pixel electrode PE, a first insulating film 11, a second insulating film 12, a third insulating film 13, a fourth insulating film 14, a fifth insulating film 15 and the like, on a side opposing the second substrate SUB2. Although not illustrated here, the first substrate SUB1 includes the first switch SW1, the source lines S, the first control line CL1 and the like, shown in FIG. 1.

The second switch SW2 is a top-gate thin film transistor. The second switch SW2 is formed on the first insulating substrate 10. The second switch SW2 comprises a semiconductor layer SC2, a control electrode EC2, a source electrode SE, a drain electrode DE2 and the like.

The semiconductor layer SC2 is provided on the first insulating substrate 10 and is formed from, for example, silicon such as a low-temperature polycrystalline silicon. The first insulating film 11 covers the semiconductor layer SC2 and is also formed on the first insulating substrate 10. The first insulating film 11 functions as a gate insulating film of the second switch SW2. The control electrode EC2 is formed on the first insulating film 11 and in a region which overlaps the semiconductor layer SC2.

The second insulating film 12 covers the control electrode EC2 and is also formed on the first insulating film 11. The source electrode SE and the drain electrode DE2 are formed on the second insulating film 12. The source electrode SE and the drain electrode DE2 are both in contact with the semiconductor layer SC2 via contact holes CH1 and CH2 which penetrate the second insulating film 12 and the first insulating film 11 to the semiconductor layer SC2. The source electrode SE is equivalent to, for example, the input terminal EI2 of the second switch SW2 and electrically connected to the first switch SW1 and the capacitor CM shown in FIG. 2. The drain electrode DE2 is equivalent to, for example, the output terminal EO2 of the second switch SW2 and is connected to the inverter INV shown in FIG. 2. The source electrode SE is shared with the third switch SW3.

The third switch SW3 is a top-gate thin film transistor and is formed immediately above the second switch SW2. The third switch SW3 comprises a semiconductor layer SC3, a control electrode EC3, a source electrode SE, a drain electrode DE3 and the like.

The semiconductor layer SC3 is formed on the second insulating film 12. In the example illustrated, the semiconductor layer SC3 entirely overlaps the semiconductor layer SC2. The semiconductor layer SC3 is formed of from an oxide semiconductor layer which contains an oxide of at least one of, for example, indium (In), gallium (Ga), zinc (Zn) and tin (Sn). The semiconductor layer SC3 is formed from, for example, a transparent amorphous oxide semiconductor (TAOS).

The source electrode SE and the drain electrode DE3 cover respectively ends of the semiconductor layer SC3, and are also formed also on the second insulating film 12. The source electrode SE is equivalent to the output terminal EO3 of the third switch SW3 and the drain electrode DE3 is equivalent to the input terminal EI3 of the third switch SW3. As described above, the source electrode SE is shared by the third switch SW3 and the second switch SW2 and in contact with the semiconductor layer SC3, the second insulating film 12 and the semiconductor layer SC2. In the example illustrated, the drain electrode DE3 is located between the control electrode EC3 and the drain electrode DE2 along the first direction X and in contact with the semiconductor layer SC3 and the second insulating film 12.

The source electrode SE and the drain electrodes DE2 and DE3 are formed from a metal material of a lamination structure in which, for example, titanium, aluminum, and titanium are stacked in this order.

The third insulating film 13 covers the semiconductor layer SC3, the source electrode SE and the drain electrodes DE3 and DE2 and is also formed on the second insulating film 12. The third insulating film 13 functions as a gate insulating film of the third switch SW3. The control electrode EC3 is formed on the third insulating film 13. As shown in, for example, FIG. 2, note that the control electrodes EC3 and EC2 may be connected commonly to the first control line CL1 or connected to different control lines, respectively, as will be described later.

The fourth insulating film 14 covers the control electrode EC3 and is also formed on the third insulating film 13. In the fourth insulating film 14, a contact hole CH3 is formed to expose the drain electrode DE3.

The fifth insulating film 15 is formed on the fourth insulating film 14. The fifth insulating film 15 is in contact with the drain electrode DE3 in the contact hole CH3, but it may not necessarily be formed in the contact hole CH3. Moreover, the fifth insulating film 15 may be omitted.

The pixel electrode PE is formed on the fifth insulating film 15. The pixel electrode PE is in contact with the drain electrode DE3 in the contact hole CH3. Thus, the third switch SW3 and the pixel electrode PE are electrically connected to each other. The pixel electrode PE is formed from, for example, a transparent conductive material such as indium tin oxide (ITO) or indium zinc oxide (IZO). Note that the pixel electrode PE may have a function as a reflective layer. In this case, the pixel electrode PE may include a reflective layer formed from a high-reflectivity metal material such as aluminum or silver. A first alignment film AL1 covers the pixel electrode PE.

The second substrate SUB2 is formed from a transparent second insulating substrate 20 of, for example, glass or resin. The second substrate SUB2 comprises a color filter layer CF, an overcoat layer OC, a common electrode CE, a second alignment film AL2 and the like, on a side opposing the first substrate SUB1.

The color filter layer CF is located on a side of the second insulating substrate 20, which opposes the first substrate SUB1. Although will not be described in full detail, the color filter layer CF includes a red color filter, a green color filter and a blue color filter. The red color filter is disposed in a subpixel which displays red as will be described later. The green color filter is disposed in a subpixel which displays green. The blue color filter is disposed in a subpixel which displays blue. The color filter layer CF may include a filter of some other color such as white, or a transparent layer.

The overcoat layer OC covers the color filter layer CF. The common electrode CE is located on a side of the overcoat layer OC, which opposes the first substrate SUB1. The common electrode CE opposes the pixel electrode PE. The common electrode CE is formed from a transparent conductive material such as indium tin oxide (ITO) or indium zinc oxide (IZO). The second alignment film AL2 covers the common electrode CE.

The liquid crystal layer LQ is held between the first substrate SUB1 and the second substrate SUB2 and contains liquid crystal molecules located between the first alignment film AL1 and the second alignment film AL2.

FIG. 7 is a plan view showing a pixel PX comprising a plurality of pixel circuits CR. In this embodiment, a pixel PX is the minimum unit which displays color images. In the example illustrated, the pixel PX contains a subpixel SP1 which displays green (G), a subpixel SP2 which displays red (R), a subpixel SP3 which displays blue (B) and a subpixel SP4 which displays white (W). The subpixels SP1, SP2, SP3 and SP4 are provided with filters of the corresponding colors, repetitively. The pixel PX may include another subpixel of some other color. Moreover, the number of subpixels included in a pixel PX is not limited to four. The pixel PX may comprise, for example, three subpixels or one subpixel.

Each pair of the subpixels SP1 and SP2 and the subpixels SP3 and SP4 are arranged along the first direction X, and each pair of the subpixels SP1 and SP3 and subpixels SP2 and SP4 are arranged along the second direction Y. Pixel electrodes PE11, PE12 and PE13 of the subpixel SP1 are respectively equal in area to pixel electrodes PE21, PE22 and PE23 of the subpixel SP2. Pixel electrodes PE31, PE32 and PE33 of the subpixel SP3 are respectively equal in area to pixel electrodes PE41, PE42 and PE43 of the subpixel SP4. In the example illustrated, pixel electrodes PE31, PE32 and PE33 of a subpixel SP3 are respectively larger than pixel electrodes PE11, PE12 and PE13 of the subpixel SP1, but the sizes can be changed as needed.

In the following description, the subpixel SP1 will be described as a typical example. The subpixel SP1 includes three pixel electrodes PE11 to PE13 and three pixel circuits CR11 to CR13. Each of the pixel circuits CR11, CR12 and CR13 holds 1-bit image data, and therefore the subpixel SP1 holds 3-bit image data.

The pixel circuits CR11, CR12, and CR13 have areas equal to each other and are arranged at an equal interval along the first direction X. On the other hand, the pixel electrodes PE11, PE12 and PE13 are formed to have an area ratio of 1:2:4 (=20:21:22). In the example illustrated, the pixel electrode PE11 has a rectangular shape and the pixel electrodes PE12 and PE13 each have substantially an L shape. The pixel electrode PE12 and the pixel electrode PE13 are arranged so that they are rotated by 180 degrees with respect to each other. An end of the pixel electrode PE12 along the second direction Y opposes a side of the pixel electrode PE13, which extends along the first direction X, and an end of the pixel electrode PE12 along the first direction X opposes a side of the pixel electrode PE13, which extends along the second direction Y. The pixel electrode PE11 is arranged to be surrounded by the pixel electrode PE12 and the pixel electrode PE13.

The pixel electrode PE11 thus configured is connected to the pixel circuit CR12 via a contact member CT11, the pixel electrode PE12 is connected to the pixel circuit CR13 via a contact member CT12, and the pixel electrode PE13 is connected to the pixel circuit CR11 via a contact member CT13. When the pixel electrodes PE11, PE12 and PE13, which have different areas, are turned on and off under control of the pixel circuits CR12, CR13 and CR11, the brightness of the subpixel SP1 can be adjusted in eight steps. That is, 3-bit gradation can be expressed.

According to this embodiment, the signal potential input into the pixel circuit CR is held at the capacitor CM. With this configuration, the number of thin film transistors included in the pixel circuit CR can be greatly reduced as compared to the case where a signal potential input to a pixel circuit is held at a storage circuit (sequential circuit) such as a flip-flop circuit. For example, the flip-flop circuit is configured by combining an inverter and a clocked inverter together. Generally, an inverter includes two thin film transistors and a clocked inverter includes four thin film transistors. By contrast, according to this embodiment, such storage circuits are not needed. Therefore, the total area of the pixel circuits CR can be greatly decreased.

Moreover, the second switch SW2 and the third switch SW3 used to refresh the capacitor CM can be formed to stack one on another as shown in FIG. 6. The p-type thin film transistor and n-type thin film transistor, which constitute the inverter INV, can be formed to stack one on another as in the case of the second switch SW2 and the third switch SW3. With this configuration, the circuit area which the thin film transistors included in the pixel circuit CR occupies can be reduced even to substantially the circuit area of three thin film transistors. By forming the pixels PX using such pixel circuits CR, a high-definition display device 100 can be obtained.

Furthermore, according to this embodiment, the first switch SW1 and the third switch SW3 are each formed of a transparent amorphous oxide semiconductor. With this configuration, leakage current can be suppressed as compared to the case where these switches are formed from some other semiconductor layer, for example, of silicon. Therefore, the number of times of refresh operation for the capacitor CM per unit time can be suppressed, thereby making it possible to lower the consumption power of the display device 100.

Second Embodiment

FIG. 8 shows a configuration example of the pixel circuit CR of a display device 100 according to the second embodiment. In the example illustrated, the pixel circuit CR11 is shown as a typical example. The second embodiment is different from first embodiment in that the control electrode EC2 of the second switch SW2 is connected to the first control line CL1, and the control electrode EC3 of the third switch SW3 is connected to the second control line CL2.

Moreover, the pixel circuit CR11 includes an auxiliary capacitor CA. The auxiliary capacitor CA comprises a terminal E3 and a terminal E4. The terminal E3 is connected to a reference potential commonly with the capacitor CM. The terminal E4 is connected to the output terminal EO2 of the second switch SW2 and the input terminal II of the inverter INV.

In this embodiment as well, an advantageous effect similar to that of the first embodiment can be obtained. Further, according to this embodiment, the second switch SW2 and the third switch SW3 can be individually controlled.

Generally, if a control electrode EC2 and a control electrode EC3 are connected to the same control line, the number of wiring lines can be decreased, but in some cases, it becomes difficult to switch the second switch SW2 and the third switch SW3 separately in terms of time depending on the characteristics of the thin film transistors which form the second switch SW2 and the third switch SW3. If the second switch SW2 and the third switch SW3 are switched simultaneously, in some cases, the potential input to the inverter INV varies due to re-distribution of electric charge. Especially, in the case where the gate capacitance made by the input-side gate electrode of the inverter INV is not sufficiently large, the potential input to the inverter INV varies greatly, thereby, in some cases, unstabilizing the output of the inverter INV.

However, according to this embodiment, the second switch SW2 and the third switch SW3 can be switched separately in terms of time. That is, it is possible to prevent the second switch SW2 and the third switch SW3 both being in the on state simultaneously, and the variation in potential input to the inverter INV can be controlled. Therefore, the output of the inverter INV can be inhibited from being unstabilized.

Moreover, with the auxiliary capacitor CA provided in the input terminal II side, even if the second switch SW2 is switched to an off (open) state in a refresh operation, the potential input to the inverter INV can be held. That is, the auxiliary capacitor CA holds the potential input to the inverter INV, and thus it is possible to suppress the variation of the potential on the output side of the inverter INV even in a refresh operation. As a result, the voltage applied to the liquid crystal layer LQ is stabilized, and therefore the display quality of the display device 100 can be improved.

Third Embodiment

FIG. 9 shows a configuration example of a pixel circuit CR of a display device 100 according to the third embodiment. In the example illustrated, the pixel circuit CR11 will be described as a typical example. The third embodiment is different from the first embodiment in that the connection relationship between the second and third switches SW2 and SW3 and the inverter INV is interchanged.

That is, the output terminal EO1 of the first switch SW1 and the terminal E2 of the capacitor CM are connected to the input terminal II of the inverter INV. The output terminal IO of the inverter INV is connected to the input terminal EI2 of the second switch SW2. The output terminal EO2 of the second switch SW2 is connected to the pixel electrode PE and the input terminal EI3 of the third switch SW3. The output terminal EO3 of the third switch SW3 is connected to the output terminal EO1, the terminal E2 and the input terminal II.

According to this embodiment, in the refresh operation, the second switch SW2 is turned off (open), and therefore the inverter INV and the pixel electrode PE are electrically separated from each other. That is, in the refresh operation, electric charge is re-distributed only between the pixel electrode PE which forms liquid crystal capacitance and the second electrode of the capacitor CM. Therefore, even if the second switch SW2 and the third switch SW3 are switched simultaneously in the refresh operation, variation of the potential supplied to the pixel electrode PE can be suppressed. As a result, the voltage applied to the liquid crystal layer LQ is stabilized, the display quality of the display device 100 can be improved.

Fourth Embodiment

Figure 10:
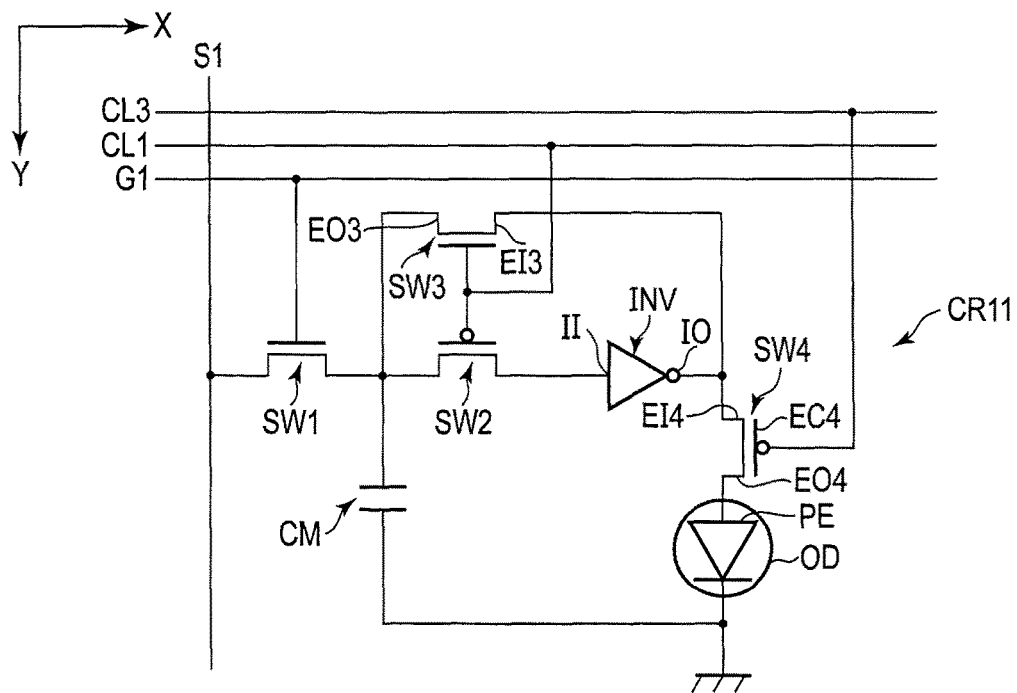
FIG. 10 is a diagram schematically showing a configuration example of a pixel circuit of a display device according to a fourth embodiment.

FIG. 10 shows a configuration example of a pixel circuit CR of a display device 100 according to the fourth embodiment. In the example illustrated, the pixel circuit CR11 will be described as a typical example. The fourth embodiment is different from the first to third embodiments in that the pixel circuit CR11 comprises an organic EL device as a display element.

The pixel circuit CR11 comprises the first switch SW1, the second switch SW2, the third switch SW3, the capacitor CM and the inverter INV, and further a fourth switch SW4 and an organic EL device OD.

The fourth switch SW4 comprises a control electrode EC4, an input terminal EI4 and an output terminal EO4. The input terminal EI4 is connected to an output terminal IO of the inverter INV and an input terminal EI3 of the third switch SW3. The output terminal EO4 is connected to a pixel electrode PE provided on one end side of the organic EL device OD. The other end side of the organic EL device OD is connected to the reference potential to which the capacitor CM is connected. In the example illustrated, the control electrode EC4 is connected to a third control line CL3.

The organic EL device OD emits light when the fourth switch SW4 is turned on and the potential held in the capacitor CM is supplied to the organic EL device OD via the second switch SW2 and the inverter INV. The direction of the current flowing through the organic EL device OD is constant at all times. Therefore, in this embodiment, the refresh operation is carried out twice continuously. That is, the output from the inverter INV is controlled to have the same polarity.

In this embodiment, an advantageous effect similar to that of the first embodiment can be obtained.

Fifth Embodiment

Figure 11:
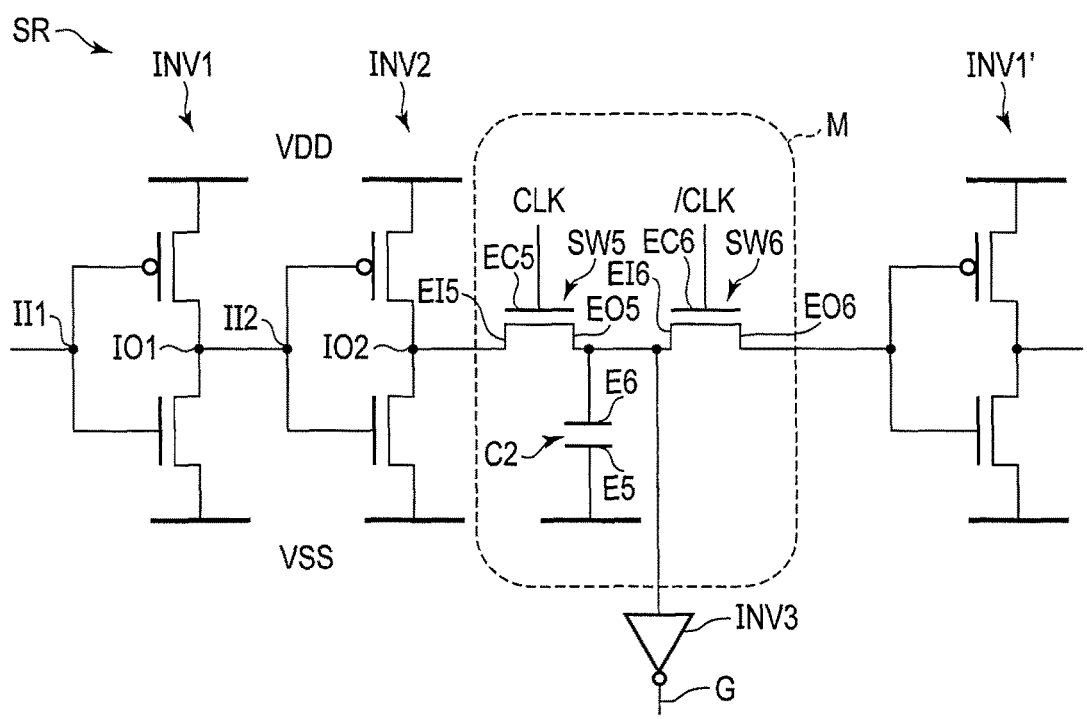
FIG. 11 is a diagram schematically showing a configuration example of a shift register of a display device according to a fifth embodiment.

FIG. 11 is a circuit diagram showing a configuration example of a shift register circuit SRC provided in a gate line drive circuit GD of a display device 100 according to the fifth embodiment. The shift register circuit SRC includes a plurality of shift registers SR connected in series. FIG. 11 shows one shift register SR in one stage. Different gate lines G are respectively connected to the output terminals of the shift registers SR. Thus, the gate line drive signals for controlling the first switch SW1 are supplied to the gate lines G sequentially via the respective shift registers SR.

The shift registers SR each comprise a first inverter INV1, a second inverter INV2, and a memory circuit M. In each shift register SR, the first inverter INV1, the second inverter INV2 and the memory circuit M are connected in series in this order. The first inverter INV1 includes an input terminal II1 and an output terminal IO1. The second inverter INV2 includes an input terminal II2 and an output terminal IO2. The first inverter INV1 and the second inverter INV2 each include an n-type thin film transistor and a p-type thin film transistor connected in parallel. The n-type thin film transistor, which constitutes the first inverter INV1 and the second inverter INV2, is formed from, for example, a transparent amorphous oxide semiconductor and the p-type thin film transistor is formed of, for example, silicon.

The memory circuit M comprises a fifth switch SW5, a sixth switch SW6 and a capacitor C2. The fifth switch SW5 includes a control electrode EC5, an input terminal EI5 and an output terminal EO5. The sixth switch SW6 includes a control electrode EC6, an input terminal EI6 and an output terminal EO6. The capacitor C2 includes terminals E5 and E6. The input terminal EI5 is connected to the output terminal IO2 of the second inverter INV2. The terminal E5 is connected to the reference potential. The terminal E6 is connected to the output terminal EO5 and the input terminal EI6 and also to the gate line G via a third inverter INV3. The output terminal EO6 is connected to the input terminal of the shift register SR of the following stage. That is, the output terminal EO6 is connected to the inverter INV1' included in the shift register SR of the following stage. The fifth switch SW5 and the sixth switch SW6 are each an n-type thin film transistor, which is formed from, for example, a transparent amorphous oxide semiconductor (TAOS).

A clock signal is supplied to the control electrode EC5 of the fifth switch SW5 and a clock signal inverted from that supplied to the fifth switch SW5 (to be referred to as an inverted clock signal hereinafter) is supplied to the control electrode EC6 of the sixth switch SW6. That is, the fifth switch SW5 and the six switch SW6 are in antiphase with respect to the on state and off state. The signal potential of the gate line drive signal input from the input terminal of the shift register SR is held at the capacitor C2 via the first inverter INV1, the second inverter INV2 and the fifth switch SW5 when the fifth switch SW5 is on (closed). The signal potential held at the capacitor C2 is supplied to the gate line G via the third inverter INV3. At this time, the sixth switch SW6 is off (open). Next, when the fifth switch SW5 is turned off (open) and the sixth switch SW6 is turned on (closed), the signal potential being held at the capacitor C2 is supplied to the input terminal of the shift register SR of the following stage via the sixth switch SW6.

According to this embodiment, the signal potential input to the shift register SR is held at the capacitor C2. With this structure, the number of the thin film transistors which form the shift register can be greatly reduced as compared to the case where the memory circuit is formed using the so-called flip-flop circuit in which, for example, an inverter and a clocked inverter are combined with each other.

For example, a shift register SRe shown in FIG. 14 as a comparative example comprises a clocked inverter CIN1e and a flip-flop circuit Fe connected to the clocked inverter CIN1e. The flip-flop circuit Fe comprises an inverter INVe and a clocked inverter CIN2e. Such a shift register SRe is constituted by ten thin film transistors.

On the other hand, the shift register SR of this embodiment is constituted by six thin film transistors. Further, the p-type thin film transistor and the n-type thin film transistor, which form each of the first inverter INV1 and the second inverter INV2, can be staked one on another as shown in FIG. 6. Therefore, the circuit area of the shift register SR of this embodiment can be made equivalent substantially to that of four thin film transistors. Therefore, as compared to the shift register SRe shown in, for example, FIG. 14, the circuit area can be reduced by 60 percent and therefore the width of the frame of the display device 100 can be reduced.

Moreover, according to this embodiment, the fifth switch SW5 and the sixth switch SW6 are formed from transparent amorphous oxide semiconductor layers, and therefore the leakage current can be suppressed as compared to the switches formed from some other semiconductor layers such as silicon, for example.

Sixth Embodiment

Figure 12:
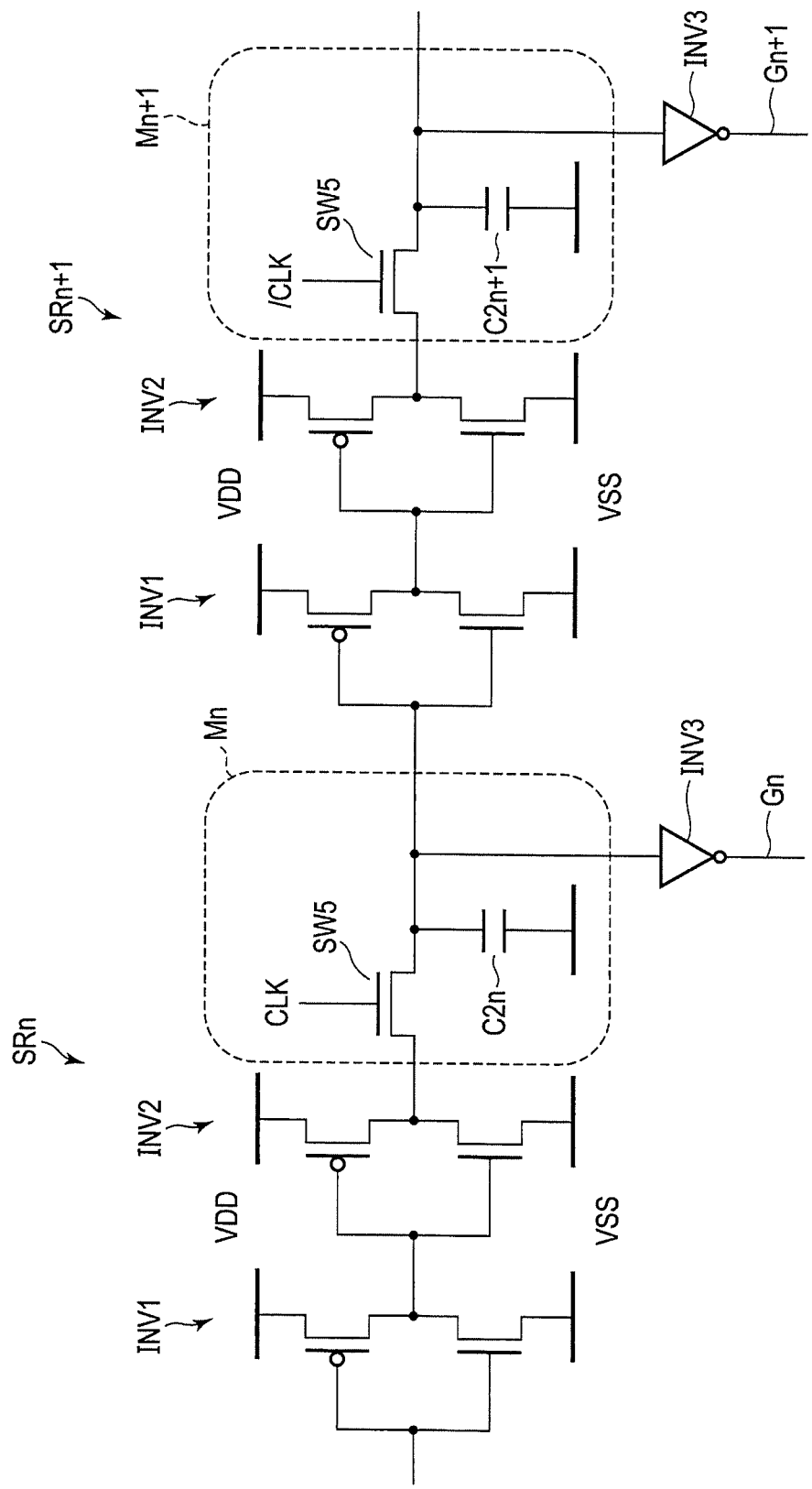
FIG. 12 is a diagram schematically showing a configuration example of a shift register of a display device according to a sixth embodiment.

FIG. 12 is a circuit diagram showing a configuration example of a shift register circuit SRC provided in a gate line drive circuit GD of the display device 100 according to the sixth embodiment. FIG. 12 shows a shift register SRn of an n-th stage included in the shift register circuit SRC and a shift register SRn+1 of an n+1-th stage.

The sixth embodiment is different from the fifth embodiment in that the memory circuit M connected to the second inverter INV2 does not comprise the sixth switch. That is, the memory circuit M of the shift register SR comprises the fifth switch SW5 and the capacitor C2.

A clock signal is input to the gate electrode of fifth switch SW5 included in a memory circuit Mn of the shift register SRn of the n-th stage, and an inverted clock signal is input to the gate electrode of the fifth switch SW5 included in the memory circuit Mn+1 of the shift register SRn+1 of the n+1-th stage. Thus, the shift register SRn of the n-th stage and the shift register SRn+1 of the n+1-st stage are in antiphase in terms of on and off. That is, the signal potential of the gate line drive signal input to the shift register SRn of the n-th stage is held at the capacitor C2n when the fifth switch SW5 of the memory circuit Mn is in the on (closed) state. The signal potential held at the capacitor C2n is supplied to the corresponding gate line Gn via the third inverter INV3. At this time, the signal potential held at the capacitor C2n is input to the input terminal of the shift register SRn+1 of the n+1-th stage, but the fifth switch SW5 of the memory circuit Mn+1 is off (open); therefore the signal potential is not supplied to the capacitor C2n+1.

Next, when the fifth switch SW5 of the memory circuit Mn is turned off (open) and the fifth switch SW5 of the memory circuit Mn+1 is turned on (closed), the signal potential being held at the capacitor C2n of the memory circuit Mn is held at the capacitor C2n+1 via the first inverter INV1, the second inverter INV2 and the fifth switch SW5 of the shift register SRn+1 of the n+1-th stage. The signal potential held at the capacitor C2n+1 is supplied to the corresponding gate line Gn+1 via the third inverter INV3.

According to this embodiment, the circuit area of the memory circuit M of the shift register SR can be further decreased as compared to that of the fifth embodiment.

Seventh Embodiment

FIG. 13 is a circuit diagram showing a configuration example of a shift register circuit SRC provided in a gate line drive circuit GD of a display device 100 according to the seventh embodiment. FIG. 13 shows a shift register SRn of the n-th stage included in the shift register circuit SRC and a shift register SRn+1 of the n+1-th stage.

The seventh embodiment is different from the sixth embodiment in that the memory circuit M does not comprise a capacitor. In this embodiment, the gate line drive signal input to the shift register SRn of the n-th stage is held at part of capacitance of the shift register SRn+1 of the following stage (the n+1st stage). That is, in a memory circuit Mn of the shift register SRn of the n-th stage, the capacitance to hold the signal potential is realized by a capacitance C3n+1 formed by the gate electrode of the thin film transistors which form the first inverter INV1 included in the shift register SRn+1 of the n+1-th stage.

According to this embodiment, the circuit area of the memory circuit M can be further decreased as compared to that of the sixth embodiment.

In each of the above-described embodiments, the first switch SW1 is equivalent to the first switch, the control electrode EC1 is equivalent to the first control electrode, the input terminal EI1 is equivalent to the first input terminal, and the output terminal EO1 is equivalent to the first output terminal. The second switch SW2 is equivalent to the second switch, the control electrode EC2 is equivalent to the second control electrode, the input terminal EI2 is equivalent to the third input terminal, and the output terminal EO2 is equivalent to the third output terminal. The third switch SW3 is equivalent to the third switch, the control electrode EC3 is equivalent to the third control electrode, the input terminal EI3 is equivalent to the second input terminal, and the output terminal EO3 is equivalent to the second output terminal. The inverter INV is equivalent to the inverter, the input terminal II is equivalent to the fourth input terminal, and the output terminal IO is equivalent to the fourth output terminal. The capacitor CM is equivalent to the capacitor, the terminal E1 is equivalent to the first terminal, and the terminal E2 is equivalent to the second terminal. The auxiliary capacitor CA is equivalent to the auxiliary capacitor, the terminal E3 is equivalent to the third terminal, and the terminal E4 is equivalent to the fourth terminal. The fourth switch SW4 is equivalent to the fourth switch, the input terminal EI4 is equivalent to the fifth input terminal, and the output terminal EO4 is equivalent to the fifth output terminal.

Moreover, the second inverter INV2 is equivalent to the inverter, the input terminal II2 is equivalent to the sixth input terminal, and the output terminal IO2 is equivalent to the sixth output terminal. The fifth switch SW5 is equivalent to the fifth switch, the input terminal EI5 is equivalent to the seventh input terminal and the output terminal EO5 is equivalent to the seventh output terminal. The capacitor C2 is equivalent to the capacitor, the terminal E5 is equivalent to the fifth terminal, and the terminal E6 is equivalent to the sixth terminal. The sixth switch SW6 is equivalent to the sixth switch, the input terminal EI6 is equivalent to the eighth input terminal, and the output terminal EO6 is equivalent to the eighth output terminal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a gate line arranged above a substrate along a first direction;
a source line arranged above the substrate along a second direction crossing the first direction;
a pixel circuit connected to the gate line and the source line and comprising a first switch, a second switch, a third switch, a capacitor and an inverter;
a pixel electrode connected to the pixel circuit, which supplies voltage to a display element,
the first switch being formed from an oxide semiconductor layer and comprising a first control electrode connected to the gate line and a first input terminal connected to the source line,
the capacitor comprising a first terminal connected to a reference potential and a second terminal connected to a first output terminal,
the third switch comprising a second input terminal and a second output terminal connected to the second terminal, and
the second switch and the inverter being connected in series between the second terminal and the second input terminal, wherein
the second switch comprises a p-type semiconductor layer and a second control electrode located on the p-type semiconductor layer,
the third switch comprises an oxide semiconductor layer located on the second control electrode and a third control electrode located on the oxide semiconductor layer,
an insulating film is located between the second control electrode and the oxide semiconductor layer, and
the second input terminal is located on the insulating film and in contact with the pixel electrode, and overlaps the p-type semiconductor layer.

2. The display device of claim 1, wherein
the second switch comprises a third input terminal connected to the second terminal and a third output terminal, and
the inverter comprises a fourth input terminal connected to the third output terminal and a fourth output terminal connected to the second input terminal and the pixel electrode.

3. The display device of claim 2, further comprising:
a first control line,
wherein
the second switch comprises a second control electrode connected to the first control line, and
the third switch comprises a third control electrode connected to the first control line.

4. The display device of claim 2, further comprising:
a first control line and a second control line,
wherein
the second switch comprises a second control electrode connected to the first control line, and
the third switch comprises a third control electrode connected to the second control line.

5. The display device of claim 4, wherein
the pixel circuit further comprises an auxiliary capacitor, and
the auxiliary capacitor comprises a third terminal connected to the reference potential and a fourth terminal connected to the third output terminal and the four input terminal.

6. The display device of claim 1, wherein
the second switch comprises a third input terminal and a third output terminal connected to the second input terminal and the pixel electrode,
the inverter comprises a fourth input terminal connected to the second terminal and a fourth output terminal connected to the third input terminal.

7. The display device of claim 6, further comprising:
a first control line,
wherein
the second switch comprises a second control electrode connected to the first control line, and
the third switch comprises a third control electrode connected to the first control line.

8. The display device of claim 1, wherein
the third switch is formed directly above the second switch.

9. The display device of claim 1, wherein
the second switch comprises a third output terminal located on the insulating film, and
the second input terminal is located between the third control electrode and the third output terminal.

10. The display device of claim 1, wherein
the second output terminal is in contact with the p-type semiconductor layer via a contact hole which penetrates at least the insulating film.

11. A display device comprising:
a gate line arranged above a substrate along a first direction;
a source line arranged above the substrate along a second direction crossing the first direction;
a pixel circuit connected to the gate line and the source line and comprising a first switch, a second switch, a third switch, a capacitor and an inverter;
a pixel electrode connected to the pixel circuit, which supplies voltage to a display element;
the first switch being formed from an oxide semiconductor layer and comprising a first control electrode connected to the gate line and a first input terminal connected to the source line;
the capacitor comprising a first terminal connected to a reference potential and a second terminal connected to a first output terminal;
the third switch comprising a second input terminal and a second output terminal connected to the second terminal; and
the second switch and the inverter being connected in series between the second terminal and the second input terminal, wherein
the display element is an organic EL device,
the pixel circuit comprises a fourth switch, and the fourth switch comprises a fifth input terminal connected to the second input terminal and a fifth output terminal connected to the pixel electrode.

\* \* \* \* \*